United States Patent [19]

Mattern et al.

[11] 3,991,361
[45] Nov. 9, 1976

[54] SEMI-AUTOMATIC COMPASS CALIBRATOR APPARATUS FOR A VEHICLE MOUNTED FLUX GATE COMPASS SYSTEM TO CANCEL OUT EFFECT OF LOCAL MAGNETIC DISTURBANCES

[75] Inventors: John Mattern, Baltimore; Earnest R. Harrison, Crownsville, both of Md.

[73] Assignee: Westinghouse Electric Corporation, Pittsburgh, Pa.

[22] Filed: Mar. 27, 1975

[21] Appl. No.: 562,615

[52] U.S. Cl. .............................. 324/43 R; 33/356
[51] Int. Cl.² ....................................... G01R 33/04
[58] Field of Search ............ 324/43 R, 47; 33/356, 33/361

[56] References Cited
UNITED STATES PATENTS

| | | | |
|---|---|---|---|
| 2,692,970 | 10/1954 | Tolles | 324/43 R |
| 2,834,939 | 5/1958 | Tolles | 324/43 R |
| 2,887,872 | 5/1959 | Halpern et al. | 324/43 R |
| 3,696,518 | 10/1972 | Leat | 33/361 |

*Primary Examiner*—Robert J. Corcoran
*Attorney, Agent, or Firm*—C. F. Renz

[57] ABSTRACT

Method and apparatus for determining and applying a feedback current to the two sense windings of a vehicle mounted flux gate compass in order to provide a compensating magnetic field to cancel out the effect of local magnetic disturbance field(s) produced by the vehicle. Two zero crossing detectors for each channel respectively associated with the two sense windings indicate when the output from a sense winding passes through a null. This indication is used to enable a sample and hold circuit for the voltage on the opposite coil. During the calibration sequence the vehicle traverses a complete circular path wherein each coil passes through two nulls resulting in two voltages being sampled and held for each coil. The two pairs of voltages are then averaged, which then results in two resultant voltages which are representative of the lateral and longitudinal components with respect to the vehicle of the disturbance field. These voltages are then used to drive a servo loop which stores the voltages indefinitely and in effect forms a non-volatile memory. The stored voltages are then used to drive two current sources which generate compensating feedback currents applied to the sense windings.

10 Claims, 7 Drawing Figures

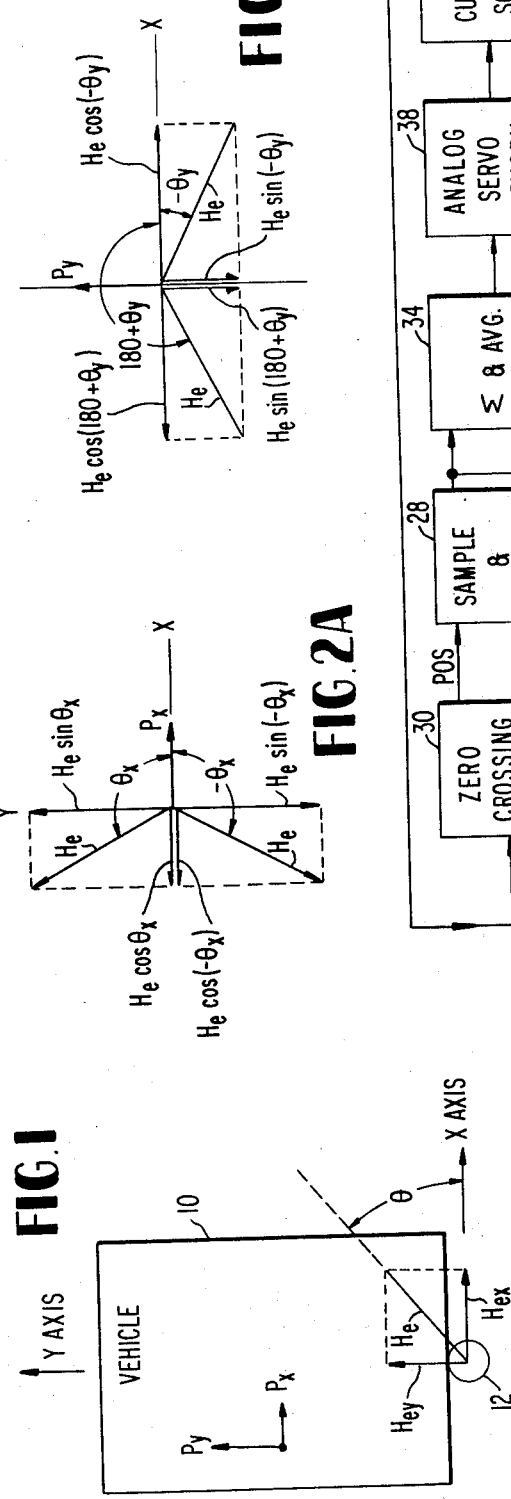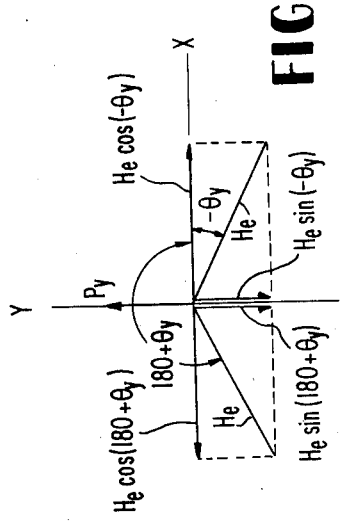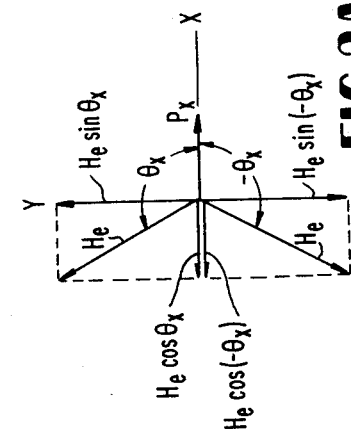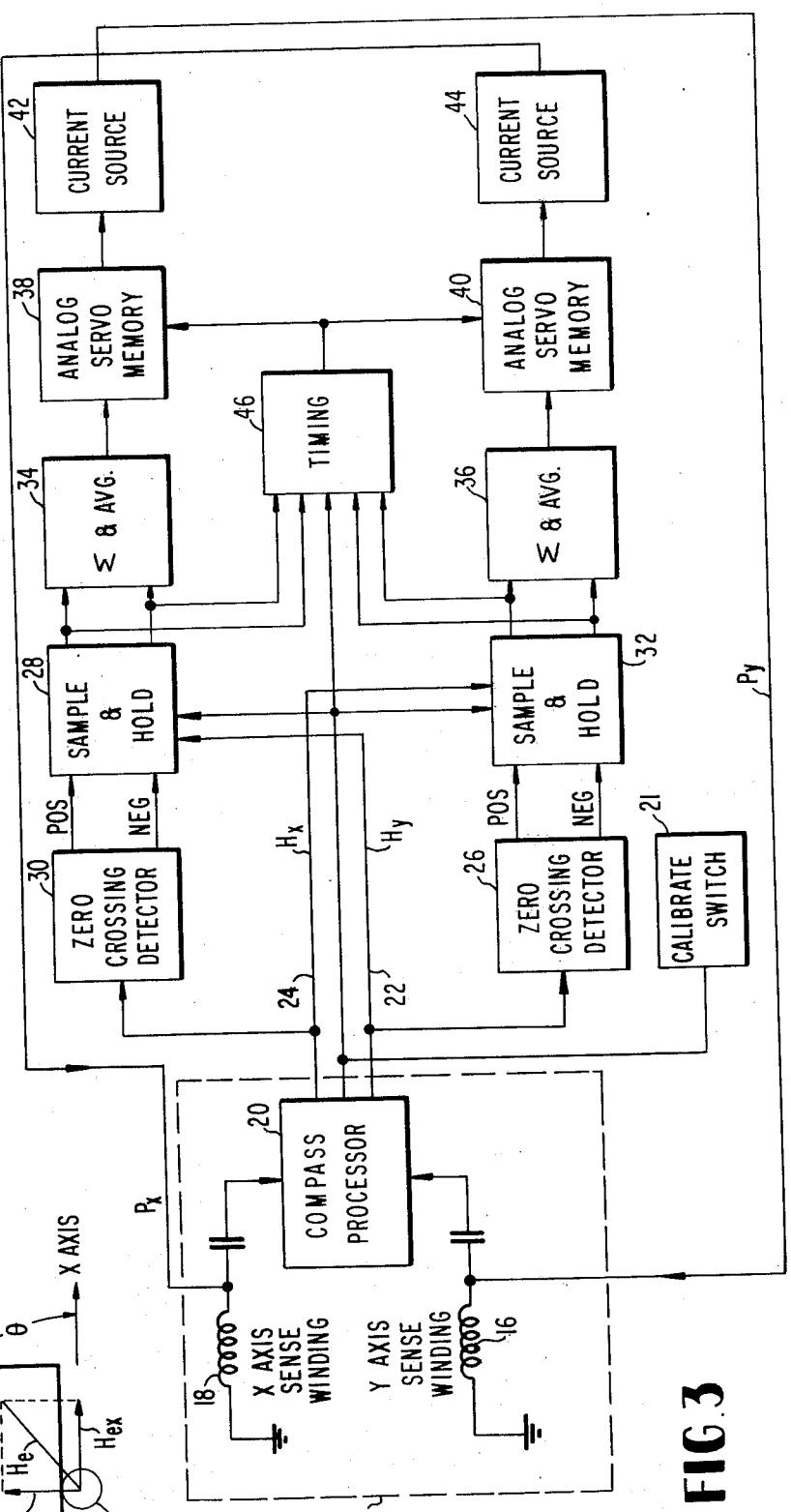

SEMI-AUTOMATIC COMPASS CALIBRATOR APPARATUS FOR A VEHICLE MOUNTED FLUX GATE COMPASS SYSTEM TO CANCEL OUT EFFECT OF LOCAL MAGNETIC DISTURBANCES

The invention herein decribed was made in the course of or under a contract or subcontract thereunder or grant with the Department of the Army (Contract DAAD05-72-C-0241).

BACKGROUND OF THE INVENTION

1. Field of the Invention

This invention relates to flux gate electronic compass systems for providing dead reckoning navigation and more particularly to means for periodically compensating for local disturbance fields tending to affect the accuracy of the magnetic heading.

2. Description of the Prior Art

The simplicity, efficiency, small size, and reliability of the magnetic compass has made it an ever present and invaluable aid to navigation since its inception. With the advent of electronic compasses, the potential of the magnetic heading sensing systems has increased since such techniques remove the need for human interpretation of the raw heading information thereby allowing faster and more accurate use of this data.

The limiting factor on the accuracy of a magnetic heading sensor frequently lies in the anomalies in the magnetic field that is sensed. Often the anomalies caused by magnetic fields on the navigating vehicle itself are principal sources of error. Elaborate methods of measurement, degaussing and compensation have been devised to correct inaccuracies caused by this type of perturbation. Where errors cannot be corrected, tabulations of deviations are often made to be used to correct the compass reading to the true magnetic heading. The principal difficulty with such correction measures is that these perturbations can change with time and use of the vehicle.

The magnetic properties of metal structures depend on the type and history of the material. The orientation of the material when it is formed and shaped often accounts for its characteristics. A violent forming operation such as heating, forging, welding, riveting, etc. can influence the magnetic domains of the material, tending to align them with the local external field at the time. If these effects tend to remain over long periods of time, with the material retaining a magnetism, the material is called magnetically "hard". If any magnetism present in an external field tends to disappear upon removal of the field, the material is designated "soft".

Even permanently magnetized hard materials tend to vary with their history, however. Ships, for example when struck by lightening when undergoing extensive refitting and material changes when sitting in a port with a fixed heading for extensive periods or even when holding a fixed course for long durations, often experience changes in their magnetic characteristics, requiring a calibration of their compasses. Less data is available for land vehicle navigation systems but there is no reason to suppose that they are any different. The constant shock and vibration of road vehicles, particularly of the track variety, such as tanks and armored personnel carriers, may well affect the long term magnetic characteristics of the vehicle disturbances. If frequent recalibration is necessary and if the recalibration procedures are elaborate requiring extensive test equipment or special test areas, this can provide a serious drawback for the effectiveness of the compass system.

SUMMARY

Briefly, the subject invention is directed to a method and apparatus for calibrating, i.e. compensating for extraneous magnetic fields, a flux gate compass located on a vehicle wherein the sensor coils are placed outside of the vehicle. When calibration is required, a compensation mode is initiated and the vehicle is driven in a circle. As the vehicle traverses the circle, the compass output signals from the pair of orthogonal sense coils are applied to a pair of positive zero crossing detectors and a pair of negative crossing detectors, as well as four sample and hold circuits respectively coupled thereto. At each zero crossing a respective sample and hold circuit stores the instantaneous signal on the other coil or channel, resulting in two signals for each coil being stored. The two signals for each coil are averaged and applied to a non-destructive analog memory device. Any previous compensating currents are removed and a new current proportional to the two averaged values for each sensor coil output is generated and fed back to the respective sensor coils to provide the required compensation. Thus the full error is measured each time the compass is calibrated.

BRIEF DESCRIPTION OF THE DRAWINGS

FIG. 1 is a vector diagram helpful in understanding the operation of the subject invention;

FIGS. 2A and 2B are vector diagrams also helpful in understanding the invention;

FIG. 3 is an electrical block diagram illustrative of the preferred embodiment of the subject invention;

DESCRIPTION OF THE PREFERRED EMBODIMENT

Figure 6:
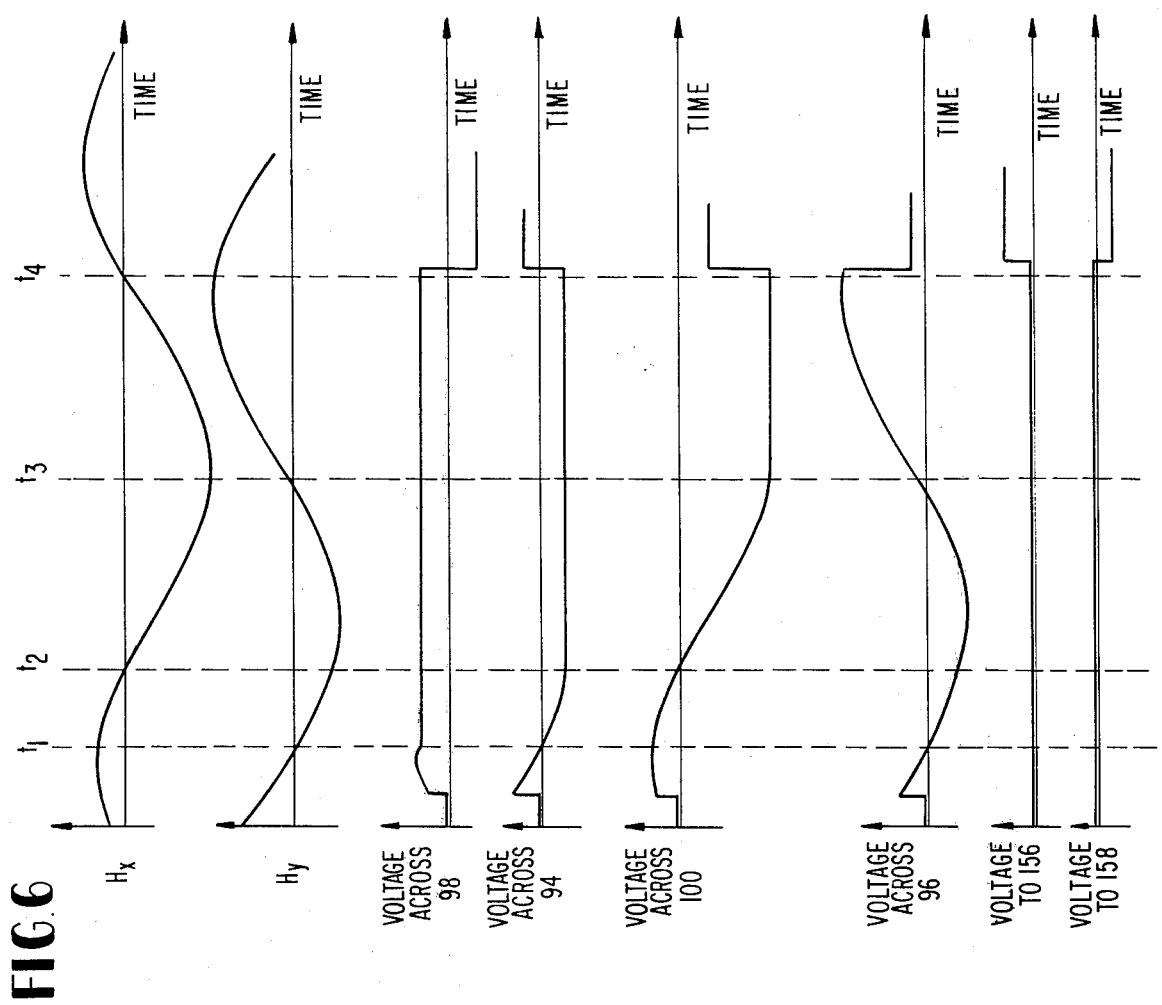
FIG. 6 is a timing diagram of selective voltage signals being illustrative of the operation of the subject invention.

The principle upon which the present invention is based evolves from two important factors. The first is that, by measuring the magnetic compass errors in a vehicle heading for different headings, some conception of the type of local permanent magnet disturbance can be obtained. The second is that all permanent magnet disturbances, horizontal or vertical, can be equated to a single longitudinal and lateral disturbance component with respect to the vehicle and are correctable as such. The present invention utilizes a flux gate compass system which is well known to those skilled in the art. Briefly, such a compass consists of a compass sensor and associated processing circuitry. The compass sensor is suspended on a pendulum in a damping fluid and is comprised of two orthogonal sense windings which are adapted to sense the magnetic field along two orthogonal axes. A magnetizable core is driven by a periodically variable reference signal of predetermined frequency so that as the core is driven into saturation, a voltage spike is induced in each sense winding proportional to the ambient magnetic field in the direction of the winding.

Referring now to the drawings and more particularly to FIG. 1, reference numeral 10 designates a vehicle incorporating a flux gate compass system having a sensor element 12 placed outside of the vehicle preferably at the rear thereof. The associated processing circuitry, indicator and compensation circuitry forming the subject invention is located inside of the vehicle. The sensor element 12 comprises a pair of level sense windings which are operable to resolve the horizontal component $H_e$ of th earth's magnetic field into a lateral component $H_{ex}$ parallel to the rear of the vehicle along what is defined as the X axis and an orthogonal longitudinal component $H_{ey}$ parallel to the length of the vehicle defined as the Y axis. Where, for example, a permanent magnetic field P exists in or on the vehicle, which is adapted to affect the proper operation of the compass and therefore must be compensated for, this field can also be resolvable into two orthogonal components $P_y$ and $P_x$. Furthermore, if the vehicle 10 is driven or caused to traverse a circular path covering 360° of orientation, each of the windings in the sensor element will go through two discrete and separate nulls, one for the positive zero crossing, (0+) and one for the negative zero crossing (0−) during a complete revolution. The nulls, however, will be observed only if the earth's field is larger than the disturbing field. This requirement determines the location for the compass as it must be at a sufficient distance so that the earth's field is not overcome by the local disturbance caused by the vehicle.

Accordingly, variable outputs of the Y and X sensors 16 and 18 are comprised of the following signals corresponding to:

$$H_y = H_e \sin\theta + p_y = H_{ey} + P_y \qquad (1)$$

$$H_x = H_e \cos\theta + P_x = H_{ex} + P_x \qquad (2)$$

When the Y axis sensor goes through a null wherein $H_y = 0$ $$0 = H_e \sin\theta + P_y \qquad (3)$$

or $$\sin\theta = \frac{-P_y}{H_e} \qquad (4)$$

$$\cos\theta = \sqrt{1-\sin^2\theta} = \sqrt{\frac{H_e^2 - P_y^2}{H_e^2}} \qquad (5)$$

substituting equation (5) into equation (2), $$H_x = H_e \sqrt{\frac{H_e^2 - P_y^2 + P_x}{H_e^2}} \qquad (6)$$

$$H_x = P_x \pm \sqrt{H_e^2 - P_y^2} \qquad (7)$$

$H_x$ will thus have two values when $H_y = 0$, i.e.

$$H_{x1} = P_x + \sqrt{H_e^2 - P_y^2} \text{ when } H_y = (0+) \qquad (8)$$

$$H_{x2} = P_x - \sqrt{H_e^2 - P_y^2} \text{ when } H_y = (0-) \qquad (9)$$

adding equations (8) and (9), $$H_{x1} + H_{x2} = 2 P_x \qquad (10)$$

or $$P_x = \frac{H_{x1} + H_{x2}}{2} \qquad (11)$$

In a like manner $$H_{y1} = P_y + \sqrt{H_e^2 - P_x^2} \text{ when } H_x = (0+) \qquad (12)$$

and $$H_{y2} = P_y - \sqrt{H_e^2 - P_x^2} \text{ when } H_x = (0-) \qquad (13)$$

then $$P_y = \frac{H_{y1} + H_{y2}}{2} \qquad (14)$$

Another way of analyzing the problem can be seen by reference to FIGS. 2A and 2B. Let $\theta_x$ and $-\theta_x$ be the angles where the X axis sensor 18 goes through zero and $-\theta_y$ and $180 + \theta_y$ be the angles when the Y axis sensor 16 goes through zero.

The measurements on the non-zero coils taken at the zero cross-over points are given by:

$$H_{x1} = P_x + H_e \cos(-\theta_x) \text{ when } H_y = (0+) \qquad (15)$$

$$H_{x2} = P_x + H_e \cos(180 + \theta_y) \text{ when } H_y = (0-) \qquad (16)$$

and $$H_{y1} = P_y + H_e \sin(\theta_y) \text{ when } H_x = (0+) \qquad (17)$$

$$H_{y2} = P_y + H_e \sin(-\theta_y) \text{ when } H_x = (0-) \qquad (18)$$

The angle $\theta_x$ is found by setting $H_x = 0$ and the angle $\theta_y$ is found by setting $H_y = 0$.
Accordingly, $$\sin \theta_x = -\sin(-\theta_x) = \sqrt{\frac{H_e^2 - P_y^2}{H_e^2}} \qquad (19)$$

and $$\cos(-\theta_x) = -\cos(180 + \theta_y) = \sqrt{\frac{H_e^2 - P_x^2}{H_e^2}} \qquad (20)$$

Substituting in equations (15) through (18) gives the result $$H_{x1} = P_x + \sqrt{H_e^2 - P_y^2} \qquad (21)$$

$$H_{x2} = P_x - \sqrt{H_e^2 - P_y^2} \qquad (22)$$

and $$H_{y1} = P_y + \sqrt{H_e^2 - P_x^2} \qquad (23)$$

$$H_{y2} = P_y - \sqrt{H_e^2 - P_x^2} \qquad (24)$$

When these pairs are added, the result is $$P_x = \frac{H_{x1} + H_{x2}}{2} \qquad (25)$$

$$P_y = \frac{H_{y1} + H_{y2}}{2} \qquad (26)$$

Thus the method of compensating for permanent magnetic fields in a flux gate compass system according to the present invention involves measuring the X axis and Y axis components when their mutually opposite axis components respectively are zero for both the positive zero crossing (0+) and the negative zero crossing (0−) and thus generating four separate signals corresponding to $H_{y1}$, $H_{y2}$ and $H_{x1}$, $H_{x2}$. By summing and averaging the Y and X axis components, error field signals of $$P_y = \frac{H_{y1} + H_{y2}}{2}$$

and $$P_x = \frac{H_{x1} + H_{x2}}{2}$$

are generated. These error field signals are fed to an analog memory and a current generated in accordance with the memory content which is thus proportional to the error fields for both the Y and X axis, is produced and continuously applied to the respective Y and X axis sense windings as a compensating feedback signal following calibration. Thus the magnitude of the equivalent disturbance in the Y axis sensor is equal to the average of the two values of the Y axis sensor when the X axis sensor is at a null. Similarly, the equivalent disturbance in the X axis sensor is the average of the two values in the X axis sensor when the Y axis sensor is at a null. All that is necessary then is to measure a permanent magnet disturbance which is less than the earth's field, and store the sensor voltages when nulls occur and then to average the correct pairs of sensor outputs. This is what is accomplished when the vehicle is driven in a calibration circle. Once the components of the permanent magnet disturbance are measured, it is a simple matter to create a counter disturbance to cancel it. In the subject invention, this is done by means of a feedback signal current applied to each sense coil that creates a magnetic field equal and opposite to the disturbance. In this manner the heading signals applied to the associated indicator(s) is correct.

Referring now to FIG. 3, there is shown a block diagram of the electrical apparatus for implementing the desired compensation according to the aforegoing discussion. The flux gate compass 14 is shown comprised of a Y axis sense winding 16 and an X axis sense winding 18 capacitively coupled to a signal processor 20. Two output lines 22 and 24 carry the signals $H_y$ and $H_x$ as specified in equations (1) and (2). The signal line 22 is fed to zero detector means 26 for the Y axis, and when a calibrate switch 21 is operated, line 22 is also coupled to an analog signal sample and hold means 28 for the X axis. In a similar fashion, signal line 24 is coupled to zero crossing detector means 30 for the X axis as well as analog signal sample and hold circuit means 32 for the Y axis upon operation of switch 21. First summing and averaging circuit means 34 is coupled to the sample and hold circuit means 28 while second summing and averaging means 36 is coupled to the sample and hold circuit means 32. The respective outputs of the circuit means 34 and 36 correspond to $$\frac{H_{x1} + H_{x2}}{2}$$

and $$\frac{H_{y1} + H_{y2}}{2},$$

which values are fed to analog signal memories 38 and 40 which are controlled by timing circuit means 46. A current source 42 is coupled to the memory 38 and provides a feedback current signal following calibration to the Y axis sense winding 16, while a similar current source 44 coupled to the memory 40 generates a feedback current signal to the X axis sense winding 18. The switch 21 additionally acts to disable the current sources 42 and 44 and to freeze the memories 38 and 40 during the calibration sequence.

The zero crossing detectors 26 and 30 thus control the sample and hold circuit means 32 and 28 for the opposite channel. Following the measurements, currents proportional to $P_x$ and $P_y$ are generated and fed back to the respective sense windings 16 and 18 for producing effects equal and opposite to those components producing the effect. Prior to discussing the preferred embodiment of the subject in greater detail, as shown in FIG. 5, reference is first made to the block diagram of FIG. 4, which is typically illustrative of a flux gate compass and its associated signal processor. Reference numeral 12 represents the sensor element 12 shown in FIG. 1, including the windings 16 and 18. Also associated therewith is a core 48 which is adapted to be driven from a clock generator 49. Where for example the core drive signal comprises a 5KHz square wave, two in-phase 10KHz sine waves appear on the Y axis lead 50 and the X axis lead 52. Because of the orthogonality of the coils 16 and 18, one output varies as the sine and the other as the cosine of the heading angle $\theta$. These two outputs appearing on leads 50 and 52 are electrically shifted in phase to be 90° out of phase with respect to each other as provided by the phase shifter 54 and then added by means of the adder and filter circuit 56. The resultant signals appearing on circuit lead 58 then comprises a 10KHz sine wave whose amplitude varies only with the earth's magnetic field strength and whose phase varies with the heading angle. This signal is passed through a variable phase shift network 60, having a declination adjustment means 62 for the area in which the vehicle 10 shown in FIG. 1 is being used. The declination phase shifter 60 rotates the heading information electrically so that the final readout will be referenced to true North rather than magnetic North. The signal is then amplified by amplifier means 64, which includes an AGC control input from an AGC circuit 66 so as to eliminate the amplitude variations and normalize the output for any given earth's magnetic field. The signal is additionally filtered to remove harmonics and the output is then fed to a pair of phase detectors 68 and 70 whose references are shifted 90° with each other so as to resolve the final outputs on circuit lines 22 and 24, respectively, which are signal voltages whose magnitudes represent the sine and cosine of the true heading angle.

Figure 4:
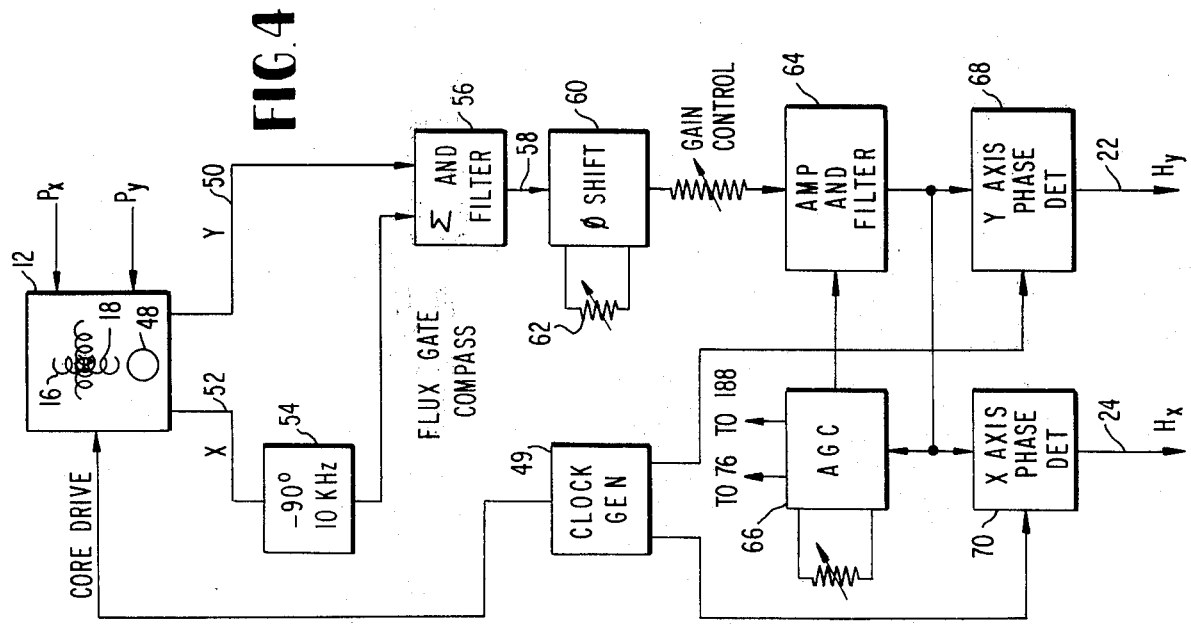
FIG. 4 is an electrical block diagram further illustrative of a flux gate compass and signal processor therefor shown broadly in the diagram of FIG. 2.
Figure 5:
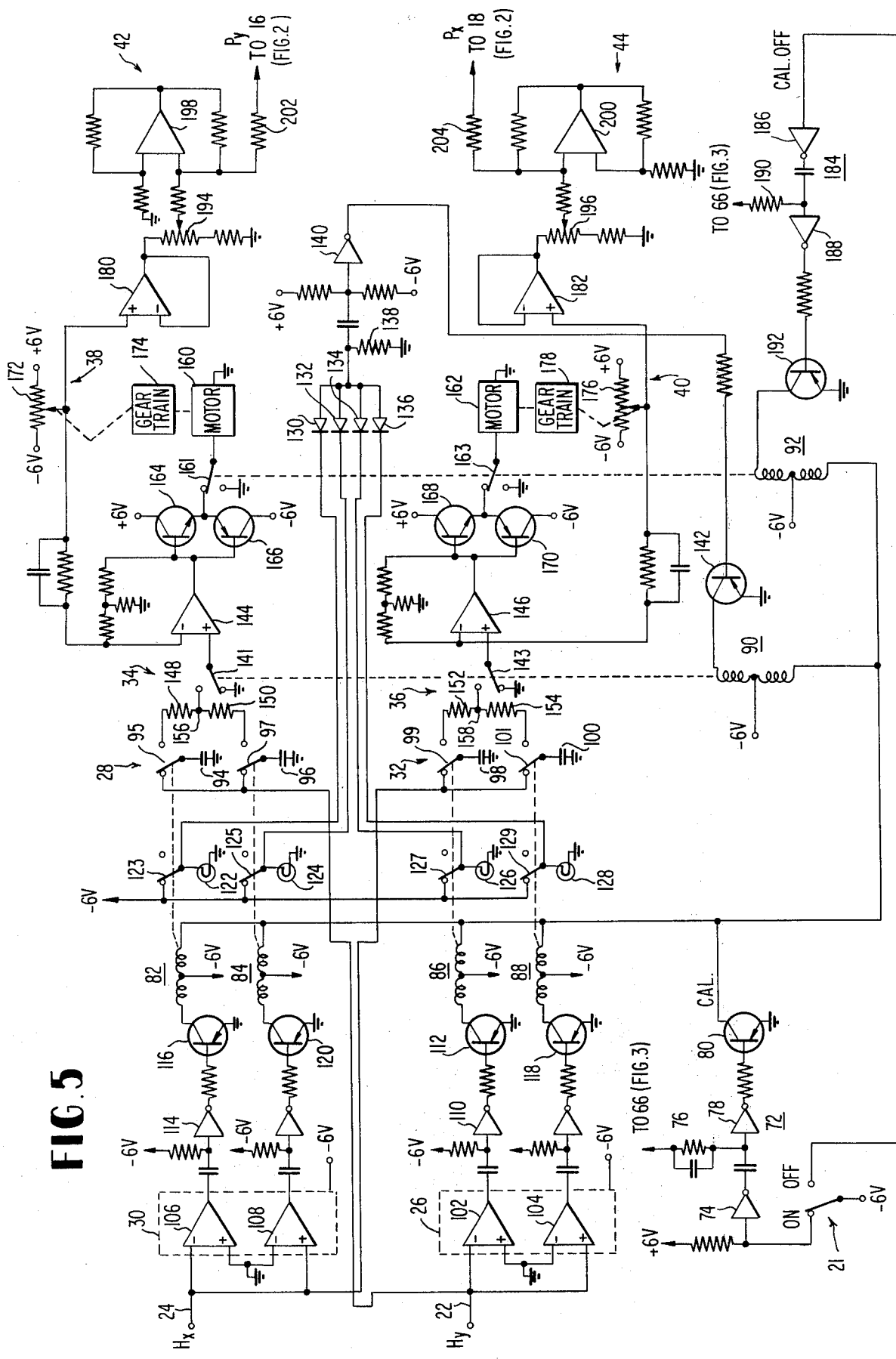
FIG. 5 is an electrical schematic diagram illustrative of the calibrate circuitry shown in the block diagram of FIG. 2.

Referring now to FIG. 5, which is an electrical schematic diagram of the compensator circuitry shown in FIG. 3, when the calibrate switch 21 is moved to an ON position, a one shot pulse generator circuit 72 feeds a calibrate pulse from the output of logic element 74 through the R-C network 76 to the AGC circuit 66 shown in FIG. 4 for turning off the AGC circuit applied to the amplifier 64. The one shot circuit 72 also feeds a calibrate pulse from the output of logic element 78 to a driver transistor 80 which operates to "reset" latch type (two separate energizing coils) relays 82, 84, 86, 88, 90 and 92 to the respective position shown in FIG. 5. The $H_y$ signal appearing on signal line 22 is applied to two separate capacitors 94 and 96 via relay contacts 95 and 97, while the X axis signal $H_x$ appearing on signal line 24 is applied to capacitors 98 and 100 via relay contacts 99 and 101. The zero crossing detector means 26 for the Y axis is comprised of two operational amplifiers 102 and 104, which are adapted to provide outputs for the positive (0+) and negative (0−) crossover points, respectively. In a like manner, the zero crossing detector means 30 for the X axis is comprised of two operational amplifiers 106 and 108, which provide respective outputs for the positive (0+) and negative (0−) crossover points for the signal $H_x$.

Referring additionally now to the timing diagram as shown in FIG. 6, whenever the $H_y$ signal appearing on circuit lead 22 changes from positive to negative at time $t_1$, the output of operational amplifier 102 changes from positive to negative. This signal is fed to an inverter circuit 110 whose output is applied to transistor 112, which becomes conductive, causing relay 86 to "set" i.e. switch to its opposite state. This causes capacitor 98 to store the $H_x$ voltage at the Y axis zero crossing. Similarly, when the $H_x$ voltage goes from positive to negative at the time $t_2$, the output of operational amplifier 106 goes negative, however, because of the operation of the inverter 114, transistor 116 is driven into conduction, which then causes relay 82 to switch to its opposite state, causing the $H_y$ voltage at $t_2$ to be stored on capacitor 94. Also, when the $H_y$ and $H_x$ voltages change from negative to positive at the times $t_3$ and $t_4$, the $H_x$ output at $t_3$ is stored on capacitor 100 and the $H_y$ output at the time $t_4$ is stored on capacitor 96 due to operation of transistors 118 and 120.

Four indicator lamps 122, 124, 126 and 128 coupled to respective relay contacts 123, 125, 127 and 129 come "on" when the calibrate switch 23 is moved to the ON position; however, they go "out" in sequence as relays 82, 84, 86 and 88 set to indicate to the system operator that the data has been taken and stored on the capacitors 94, 96, 98 and 100. Four semiconductor diodes 130, 132, 134 and 136 are also coupled to the relay contacts 123, 125, 127 and 129 associated with the lamps 122, 124, etc. and form a NAND gate, which causes the voltage on resistor 138 to go from −6 volts to ground potential when all four relays 82, 84, 86 and 88 have set, that is, switched to the "hold" position. This causes a trigger signal to be fed from inverter 140 to transistor 142 which becomes conductive and switch relay 90 including relay contacts 141 and 143 to its opposite state from that shown wherein the inputs of operational amplifiers 144 and 146 are grounded.

Meanwhile, the voltages on capacitors 94 and 96 which in effect comprise analog signals representative of $H_{y1}$ and $H_{y2}$ are averaged by the summing resistors 148 and 150 and the voltage on capacitors 98 and 100 which comprise analog signals representative of $H_{x1}$ and $H_{x2}$ are averaged by means of the summing resistors 152 and 154. The voltages appearing at summing points 156 and 158 are representative of the longitudinal (Y axis) and lateral (X axis) components $P_y$ and $P_x$, respectively, of the disturbance field P. When relay 90 is switched, the voltages appearing at summing points 156 and 158 are fed to the operational amplifiers 144 and 146. These amplifiers are selectively chosen to have extremely high input impedances so that the respective capacitors 94, 96, 98 and 100 coupled thereto are not discharged. The output of the operational amplifiers 144 and 146 are coupled to respective electrical motors 160 and 162 through separate contacts 161 and 163 of relay contacts of relay 92 and driver circuits comprised of transistors 164, 166, and transistors 168, 170. The motor 160 couples to the wiper element of potentiometer 172 through a gear train 174. In a like manner, motor 162 couples to the wiper of a potentiometer 176 through a gear train 178.

It should also be pointed out that the inputs to operational amplifiers 144 and 146 are grounded during the measurement time causing the potentiometers to be turned to their center position. In this position the corrections are zero. After the calibration measurements have occurred, relay 90 is set and the new values are set into the potentiometers causing new values of $P_x$ and $P_y$ to be introduced into the operational amplifiers 144 and 146.

The wiper of potentiometer 172 is electrically connected to one input of an operational amplifier 180 and one input of the operational amplifier 144 which forms a servo loop causing the wiper of potentiometer 172 to move in such a manner that the voltage at the negative input of operational amplifier 144 is equal to the voltage on the positive input of operational amplifier 180. In a similar manner, the wiper of potentiometer 176 forms a servo loop between the negative input of operational amplifier 146 and the positive input of operational amplifier 182. The voltage levels now at the wipers of potentiometers 172 and 176 are proportional to the longitudinal $P_y$ and lateral $P_x$ components of the disturbance field P.

After the servo loops have settled (one second), the calibrate switch 21 is set to the OFF position, which is adapted to activate a one shot pulse generator circuit 184, including two logic inverters 186 and 188. The output of inverter 186 is additionally coupled to the AGC circuit 66 in FIG. 4 by means of resistor 190. The output of inverter 188 is adapted to turn transistor 192 on, causing relay 92 to switch to its opposite state from that shown in FIG. 5. The two sets of relay contacts 161 and 163 of relay 92 ground the motors 160 and 162, causing the wiper of potentiometers 172 and 176 to remain stationary and in effect store the calibration voltages in a non-volatile state, meaning that even if the system power is turned OFF and ON, the calibrate voltages will remain. Operational amplifiers 180 and 182 comprise buffer amplifiers to prevent any loading on the servo loops. The outputs of operational amplifiers 180 and 182 are fed by means of potentiometers 194 and 196 to the operational amplifiers 198 and 200, whose associated circuitry form current sources, which feed back current signals via resistors 202 and 204 to sensor windings 16 and 18 respectively. Potentiometers 194 and 196 are simply used to adjust the voltage to current transfer ratio of the current sources 42 and 44 to direct value.

Thus what has been shown and described is a method and apparatus used to determine and apply a feedback current to the sense windings of a flux gate compass to provide a compensating magnetic field to cancel out the effect of a magnetic disturbance by the operation of two zero crossing detectors for each channel, which indicate when a sense winding passes through a null. This indication is used to enable a separate sample and hold voltage for the other coil. Since for a complete revolution of the vehicle including the compass system, each sensor coil passes through two nulls, resulting in two voltages being stored from each coil. These two voltages are then averaged, resulting in two voltages which are representative of the lateral (X axis) and longitudinal (Y axis) components $P_x$ and $P_y$ of the disturbance field P. These voltages are then used to drive a servo loop which stores them indefinitely and in effect forms a non-volatile memory. The stored voltages are then used to drive two current sources which apply feedback current to the sense windings to compensate for the lateral $P_x$ and longitudinal $P_y$ components of the disturbance field P.

Having thus described what is at present considered to be the preferred method and embodiment of the subject invention,

We claim:

1. A method for compensating a vehicle mounted flux gate compass system having a pair of orthogonal sense windings for the effect of magnetic perturbations caused by permanently magnetized material on the vehicle, comprising the steps of:
   resolving the horizontal component of the earth's magnetic field and said perturbations into two orthogonal signal components, each orthogonal signal component representing both said earth's magnetic field and said perturbations, one of said orthogonal signal components parallel to the longitudinal axis of the vehicle and the other perpendicular to the longitudinal axis of the vehicle;
   causing the vehicle to traverse a closed generally circular path;
   determining the value of said orthogonal signal components of each of said axes at a time when the component value for the other axis is at a null, which null exists at the zero signal crossover from positive polarity to negative polarity and negative polarity to positive polarity, thereby providing a pair of signal values for each of said axes during a complete traverse of said vehicle;
   separately storing individual signal values of said two pairs of signal values;
   summing and averaging separately each pair of signal values for each axis to obtain a first and second resultant output signal, said first and second resultant output signals being representative of the longitudinal and transverse components of said magnetic perturbations;
   storing said first and second resultant output signals;
   generating first and second respective current signals from said first and second resultant output signals; and
   applying said first and second current signals as a respective compensating feedback signal to said pair of orthogonal sense windings of said flux gate compass system.

2. Apparatus for compensating a vehicle mounted flux gate compass system for the effect of magnetic perturbations caused by permanently magnetized material on the vehicle, said compass system including a pair of orthogonal sense windings and signal processor means coupled thereto for resolving the horizontal component of the earth's magnetic field and said magnetic perturbations into a component parallel to the longitudinal axis of the vehicle and into a component parallel to the transverse axis of the vehicle, wherein the improvement comprises compensator circuitry coupled to said pair of sense windings and including:

a first pair of analog signal storage devices coupled to said signal processor means, being adapted to selectively store a respective first and second longitudinal axis signal component;
first control circuit means coupled to said signal processor means and being responsive to said transverse axis signal component to control said first pair of analog signal storage devices to cause one of said devices to store the value of said longitudinal axis signal component when said transverse axis signal component goes through a null in a first polarity direction and to cause the other of said devices to store the value of said longitudinal axis signal component when said transverse axis signal component goes through a null in a second polarity direction;
a second pair of analog signal storage devices coupled to signal processor means, being adapted to selectively store a respective first and second transverse axis signal component;
second control circuit means coupled to said signal processor means and being responsive to said longitudinal axis signal component to control said second pair of signal storage devices to cause one of said second pair of devices to store the value of said transverse axis signal component when said longitudinal axis signal component goes through a null in a first polarity direction and to cause the other of said second pair of devices to store the value of said transverse axis signal component when the longitudinal axis signal component goes through a null in a second polarity direction;
first circuit means coupled to said first pair of storage devices and being operable to average the signals stored and provide a first resultant output signal therefrom;
second circuit means coupled to said second pair of storage devices and being operable to average the signals stored and provide a second resultant signal therefrom;
first current signal source means coupled to said first circuit means and being responsive to said first resultant signal to generate a first compensating feedback current signal applied to one of said pair of sense windings; and
second current signal source means coupled to said second circuit means and being responsive to said second resultant signal to generate a second compensating feedback current signal applied to the other of said pair of sense windings.

3. The apparatus as defined by claim 2 and additionally including first analog memory circuit means coupled between said first circuit means and said first current signal source means for selectively storing said first resultant signal for a predetermined time period; and second analog memory circuit means coupled between said second circuit means and said second current signal source means for storing said second resultant signal for a predetermined time period.

4. The apparatus as defined by claim 3 wherein said first and second pairs of analog signal storage devices include analog signal sample and hold circuit means.

5. The apparatus as defined by claim 4 wherein said first control circuit means comprises a first pair of zero signal crossing detectors wherein one of said first pair of detectors provides a first control output signal when said transverse axis signal component goes from a positive polarity to a negative polarity and the other of said first pair of detectors provides a second output control signal when said transverse axis signal component goes from a negative polarity to a positive polarity; and wherein said second control means comprises a second pair of zero signal crossing detectors wherein one of said second pair of detectors provides a third control output signal when said longitudinal axis signal component goes from a positive polarity to a negative polarity and the other of said second pair of detectors provides a fourth control output signal when said longitudinal axis signal component goes from a negative polarity to a positive polarity.

6. The apparatus as defined by claim 5 and wherein each said sample and hold circuit means includes a signal storage capacitor and a first relay circuit means operable in response to the respective control output signal from the respective component signal to apply a signal component to said storage capacitor.

7. The apparatus as defined by claim 6 wherein said first and second circuit means for averaging each comprises a resistance summing network including a summing point circuit junction.

8. The apparatus as defined by claim 7 wherein said first and second analog memory circuit means each comprises a non-volatile memory circuit.

9. The apparatus as defined by claim 8 wherein said non-volatile memory circuit is comprised of a servo loop including an electric motor, first amplifier means including a pair of inputs and having one of said inputs coupled to said summing point circuit junction and an output coupled to and adapted to drive said motor, a potentiometer coupled across a voltage source and having a slider element driven by said motor, and electrically coupled to the other input of said first amplifier means, and second amplifier means having an input also electrically coupled to the slider of said potentiometer and an output coupled to the input of the respective current signal source means of said first and second current signal source means.

10. The apparatus as defined by claim 9 wherein said servo loop additionally includes transistor driver circuit means and second relay circuit means coupling the output of said first amplifier means to said motor, said second relay circuit means being operable in response to the operation of all said first relay circuit means to disconnect said motor from said driver circuit means.

* * * * *